United States Patent
Yamamichi et al.

(10) Patent No.: US 8,344,498 B2
(45) Date of Patent: Jan. 1, 2013

(54) SEMICONDUCTOR DEVICE

(75) Inventors: Shintaro Yamamichi, Tokyo (JP); Kentaro Mori, Tokyo (JP); Hideya Murai, Tokyo (JP)

(73) Assignee: NEC Corporation, Tokyo (JP)

( * ) Notice: Subject to any disclaimer, the term of this patent is extended or adjusted under 35 U.S.C. 154(b) by 183 days.

(21) Appl. No.: 12/739,302

(22) PCT Filed: Oct. 22, 2008

(86) PCT No.: PCT/JP2008/069149
§ 371 (c)(1), (2), (4) Date: Apr. 22, 2010

(87) PCT Pub. No.: WO2009/054414
PCT Pub. Date: Apr. 30, 2009

(65) Prior Publication Data
US 2010/0244231 A1    Sep. 30, 2010

(30) Foreign Application Priority Data
Oct. 22, 2007  (JP) .................................. 2007-273929

(51) Int. Cl.
H01L 23/02  (2006.01)

(52) U.S. Cl. ................ 257/692; 257/678; 257/E23.001; 438/106

(58) Field of Classification Search .......... 257/666–692, 257/E23.001; 438/106
See application file for complete search history.

(56) References Cited

U.S. PATENT DOCUMENTS
6,239,489 B1 * 5/2001 Jiang ............................. 257/738
2002/0089043 A1 * 7/2002 Park et al. ..................... 257/668

FOREIGN PATENT DOCUMENTS
| JP | 11-126951 A | 5/1999 |
| JP | 2001-15650 A | 1/2001 |
| JP | 2002-141636 A | 5/2002 |
| JP | 2003-46028 A | 2/2003 |
| JP | 2004-200243 A | 7/2004 |
| JP | 2005-5548 A | 1/2005 |
| JP | 2005-108898 A | 4/2005 |
| JP | 2006-245076 A | 9/2006 |
| JP | 2007-134569 A | 5/2007 |

OTHER PUBLICATIONS
International Search Report for PCT/JP2008/069149, mailed Nov. 18, 2008.

* cited by examiner

Primary Examiner — Jermone Jackson, Jr.
Assistant Examiner — Fang-Xing Jiang

(57) ABSTRACT

A semiconductor device comprises: a semiconductor element; a support substrate arranged on a surface of the semiconductor element opposite to a surface thereof provided with a pad, the support substrate being wider in area than the semiconductor element; a burying insulating layer on the support substrate for burying the semiconductor element therein; a fan-out interconnection led out from the pad to an area on the burying insulating layer lying more peripherally outwardly than the semiconductor element; and a reinforcement portion arranged in a preset area on top of outer periphery of the semiconductor element for augmenting the mechanical strength of the burying insulating layer and the fan-out interconnection.

3 Claims, 11 Drawing Sheets

SEMICONDUCTOR DEVICE

The present application is the National Phase of PCT/JP2008/069149, filed on Oct. 22, 2208 which claims priority rights based on a JP Patent Application 2007-273929 filed in Japan on Oct. 22, 2007. The entire disclosure of the patent application of the senior filing date is to be incorporated herein by reference thereto.

TECHNICAL FIELD

This invention relates to a semiconductor device in which there is enclosed a semiconductor element.

BACKGROUND

With sustaining reduction in weight and thickness of electronic equipment, the technique of high density packaging of a semiconductor device is steadily progressing in keeping pace with miniaturization and integration of the semiconductor device itself. Heretofore, in packaging a semiconductor element, a wire bonding connection that uses gold wiring traces, for example, and a flipchip connection that uses a solder ball, are used for interconnecting a wiring board of a package and the semiconductor element.

In the wire bonding connection, packaging may be performed to advantage at a low cost in case there are a smaller number of pads of the semiconductor element. It is however necessary to reduce the wire diameter as the pitch of pads of the semiconductor element becomes narrower. As a result, there has been a problem of lowering in the yield in the assembly process due to wire breakages, or the like.

The flipchip connection, as compared to the wire bonding connection, may provide for high-speed transmission between the semiconductor element and the wiring board. However, the connection strength of the solder ball is lowered as the number of pads of the semiconductor element is increased and as the pitch of the pads becomes narrower. As a result, cracking or the like defects occur frequently at the connection sites.

Recently, a technique of enclosing a semiconductor element in a wiring board inclusive of a support substrate, a so-called semiconductor element enclosing technique, has been proposed in, for example, Patent Documents 1 to 3. This technique represents a high density packaging technique that has implemented higher integration and higher functions of semiconductor devices. In addition, the technique has a number of merits including inter alia a thinner package thickness, low costs, accommodation to higher frequencies, low-stress plating connection and an improved electro-migration characteristic etc.

Patent Document 1, for example, discloses a technique in which an electronic component burying board is a laminated board composed of a resin film and a metal foil. A component burying recess is formed in the resin film, and an electronic component is buried and secured in the recess. The resulting assembly is pressed under heating and subjected to processing with a heated roll for lamination to form a conductor wiring.

Patent Document 2 discloses a structure in which an electronic circuit is enclosed in a board of an insulating resin in which there is buried an electronic component such as a semiconductor chip. Bumps are formed so as to be connected to the electronic circuit, and is connected to a first interconnection.

Patent Document 3 discloses a structure of a semiconductor element accommodating package configured to suppress heat-induced flexure or warping. The structure includes a board on which to set the semiconductor element, a frame of, for example, an epoxy resin, and a plurality of lead terminals on an inner surface of the frame. The lead terminals are each provided with a widened portion whose width progressively increases towards an outer part of the frame.
Patent Document 1:
JP Patent Kokai Publication No. JP2002-141636A
Patent Document 2:
JP Patent Kokai Publication No. JP2007-134569A
Patent Document 3:
JP Patent Kokai Publication No. JP2004-200243A

SUMMARY

The disclosures of the Patent Documents 1 to 3 are incorporated herein by reference. The following is an analysis of the related art given by the present invention.

In the Patent Documents 1 to 3, relevant to the above mentioned semiconductor element enclosing technique, there is no mention of a problem inherent in the enclosure of the semiconductor element in case of using a support substrate of a larger area, such as 510 mm by 610 mm, in actual mass production, or a solution for such problem.

As a result of perseverant researches, in this connection, the present inventors have found the following. That is, when a silicon semiconductor element is loaded on a large-sized support substrate, with its pad side surface facing to a side opposite to the support substrate side, and is then enclosed by a burying insulating layer, the support substrate in its entirety becomes flexed in the course of curing of the burying insulating layer when the temperature falls from the curing temperature to the ambient temperature. Specifically, the support substrate becomes flexed so as to be convexed towards below, with solely the semiconductor element loading area becoming locally convexed towards above. This is brought about due to difference in thermal expansion coefficients of the support substrate, semiconductor element and the burying insulating layer.

If the support substrate is cut to form a number of semiconductor devices, internal stresses are concentrated on the outer periphery of the semiconductor element because the direction of flexure of the support substrate in its entirety is reverse to the direction of local flexure of the semiconductor element. Thus, in a reliability evaluation test, such as a cyclic temperature test, the insulating layer cracked frequently in its area in register with the vicinity of the outer periphery of the semiconductor element, for a number of cycles less than a preset number of cycles, thus causing disconnection failures of the package interconnections.

It is a primary object of the present invention to overcome the problem connected with the shape of flexure newly found in connection with the semiconductor element enclosing structure employing a large-sized support substrate, and to provide a semiconductor device of high density, thin thickness and low cost free from the problem of low reliability ascribable to inner stress concentration in an ultimate semiconductor device.

In a first aspect of the present invention a semiconductor device includes a semiconductor element, and a support substrate arranged on a surface of the semiconductor element opposite to a surface thereof provided with a pad, with the support substrate being wider in area than the semiconductor element. The semiconductor device also includes a burying insulating layer on the support substrate for burying the semiconductor element therein, and a fan-out interconnection led out from the pad to an area on the burying insulating layer lying more peripherally outwardly than the semiconductor element. The semiconductor device further includes a reinforcement portion arranged in a preset area above the outer periphery of the semiconductor element for augmenting the mechanical strength of the burying insulating layer and the fan-out interconnection.

In a second aspect of the present invention a semiconductor device includes a semiconductor element, and a support substrate arranged on a surface of the semiconductor element opposite to a surface thereof provided with a pad, with the support substrate being wider in area than the semiconductor element. The semiconductor device also includes a burying insulating layer on the support substrate for burying the semiconductor element, and a fan-out interconnection led out from the pad to an area on the burying insulating layer lying more peripherally outwardly than the semiconductor element. The semiconductor device further includes a reinforcement portion via interconnection connected to at least one end of the semiconductor element without being connected to the fan-out interconnection.

According to the present invention, a semiconductor device of high reliability may be provided which has enclosed therein a number of semiconductor elements each carrying an increased number of pads at a narrow pitch. In particular, the cyclic temperature test characteristics of the semiconductor device may be improved. Moreover, since the interconnections are directly led out from the pads of the semiconductor element, the semiconductor device may be reduced in size and thickness, while being improved in its electro-migration characteristic. In addition, since the support substrate, carrying the semiconductor element, is of a large size, the semiconductor device is high in production efficiently, while being low in cost.

PREFERRED MODES

Figure 1:
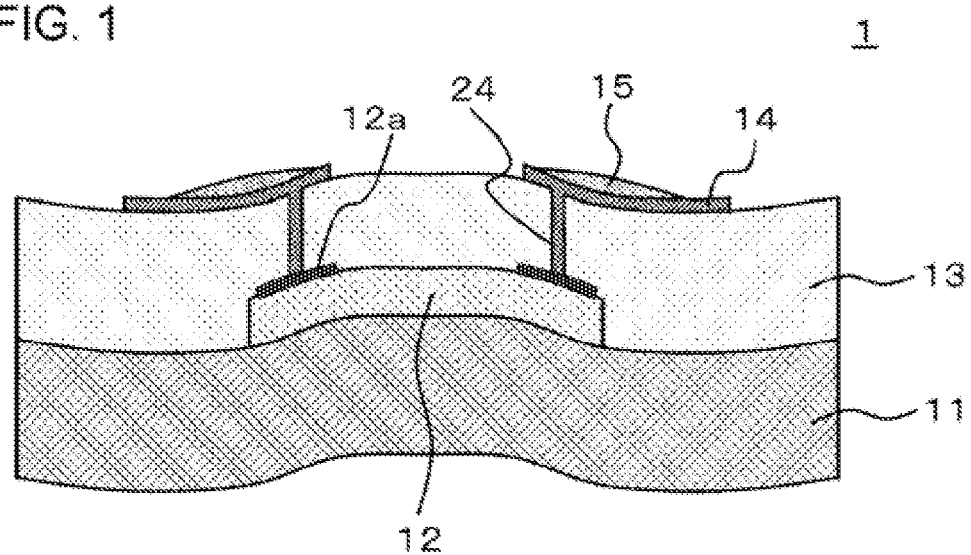
FIG. 1 is a schematic cross-sectional view showing the configuration of a semiconductor device according to Example 1 of the present invention.

An exemplary embodiment 1 of the present invention includes a semiconductor element (12 of FIG. 1), and a support substrate (11 of FIG. 1) arranged on a surface of the semiconductor element (12 of FIG. 1) opposite to its surface provided with a pad, with the support substrate (11 of FIG. 1) being wider in area than the semiconductor element (12 of FIG. 1). The exemplary embodiment 1 also includes a burying insulating layer (13 of FIG. 1) on the support substrate for burying the semiconductor element (12 of FIG. 1) therein, and a fan-out interconnection (14 of FIG. 1) led out from the pad to an area on the burying insulating layer (13 of FIG. 1) lying more peripherally outwardly than the semiconductor element (12 of FIG. 1). The exemplary embodiment 1 further includes a reinforcement portion (for example, an interconnection thickness reinforcement portion (15 of FIG. 1) arranged in a preset area above the outer periphery of the semiconductor element (12 of FIG. 1) for augmenting the mechanical strength of the burying insulating layer (13 of FIG. 1) and the fan-out interconnection (or wiring trace, 14 of FIG. 1) (mode 1).

The following modes are also possible.

Preferably, the reinforcement portion is an interconnection thickness reinforcement portion that augments the thickness of the fan-out interconnection (mode 1-1).

Preferably, the interconnection thickness reinforcement portion is formed of the same material as that of the fan-out interconnection (mode 1-2).

Preferably, the modulus of elasticity of the interconnection thickness reinforcement portion is higher than that of the fan-out interconnection (mode 1-3).

Preferably, the film thickness of the interconnection thickness reinforcement portion is smaller than that of the fan-out interconnection (mode 1-4).

Preferably, the reinforcement portion is an insulating layer thickness reinforcement portion that augments the thickness of the burying insulating layer (mode 1-5).

Preferably, the insulating layer thickness reinforcement portion is formed of the same material as that of the burying insulating layer (mode 1-6).

Preferably, the modulus of elasticity of the insulating layer thickness reinforcement portion is higher than that of the burying insulating layer (mode 1-7).

Preferably, the film thickness of the insulating layer thickness reinforcement portion is smaller than that of the burying insulating layer (mode 1-8).

Preferably, the reinforcement portion is an interconnection width reinforcement portion that augments the width of the fan-out interconnection (mode 1-9).

Preferably, the interconnection width reinforcement portion is formed of the same material as that of the fan-out interconnection (mode 1-10).

Preferably, the modulus of elasticity of the interconnection width reinforcement portion is higher than that of the fan-out interconnection (mode 1-11).

Preferably, the interconnection width of the interconnection width reinforcement portion is wider than that of the fan-out interconnection (mode 1-12).

Figure 3:
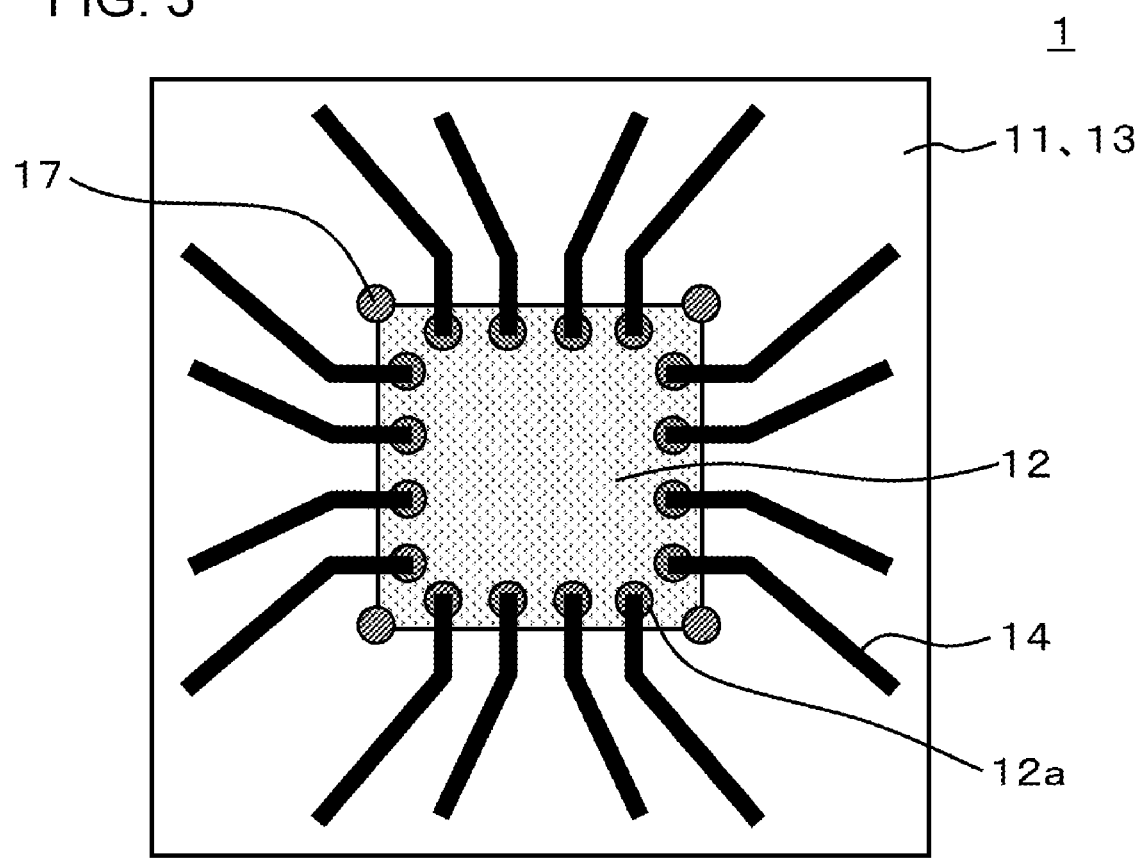
FIG. 3 is a schematic plan view showing the configuration of a semiconductor device according to Example 3 of the present invention.

An exemplary embodiment 2 of the present invention includes a semiconductor element (12 of FIG. 3), and a support substrate (11 of FIG. 3) arranged on a surface of the semiconductor element (12 of FIG. 3) opposite to its surface provided with a pad, with the support substrate being wider in area than the semiconductor element (12 of FIG. 3). The exemplary embodiment 2 also includes a burying insulating layer (13 of FIG. 3) on the support substrate (11 of FIG. 3) for burying the semiconductor element (12 of FIG. 3) therein, and a fan-out interconnection (14 of FIG. 3) led out from the pad to an area on the burying insulating layer (13 of FIG. 3) extending to an area lying more peripherally outwardly than the semiconductor element (12 of FIG. 3). The exemplary embodiment 2 further includes a reinforcement portion via interconnection (17 of FIG. 3) connected to at least one end of the semiconductor element (12 of FIG. 3) without being connected to the fan-out interconnection (14 of FIG. 3) (mode 2).

The following modes are also possible.

Preferably, the reinforcement portion via interconnection is formed of the same material as that of the fan-out interconnection (mode 2-1).

Preferably, the modulus of elasticity of the reinforcement portion via interconnection is higher than that of the fan-out interconnection (mode 2-2).

Preferably, at least one insulating layer is provided on the fan-out interconnection (mode 2-3).

Preferably, at least one insulating layer and at least one interconnection layer are laminated on the fan-out interconnection (mode 2-4).

Preferably, there is further provided an external terminal provided in an opening in an uppermost insulating layer, with the external terminal being electrically connected to the fan-out interconnection (mode 2-5).

Preferably, a plurality of the semiconductor elements are provided enclosed (mode 2-6).

Preferably, one or more passive elements other than the semiconductor element are provided in a buried fashion (mode 2-7).

Example 1

A semiconductor device according to Example 1 of the present invention will now be described with reference to the drawings. FIG. 1 depicts a schematic cross-sectional view showing the configuration of a semiconductor device according to Example 1 of the present invention.

A semiconductor device 1 of Example 1 is a package in which a semiconductor element 12 is enclosed in the bulk of a wiring board, which is comprised of a support substrate 11, a burying insulating layer 13 and a plurality of fan-out interconnections 14. The semiconductor device 1 includes, in a preset area on top of an outer peripheral part of the semiconductor element 12, an interconnection thickness reinforcement portion 15 designed to prevent cracking in the burying insulating layer 13 provided in a preset area on top of the outer peripheral part of the semiconductor element 12.

The semiconductor element 12 is a semiconductor chip, such as a silicon semiconductor element, and includes a plurality of pads, not shown, on its one side. The semiconductor element 12 is mounted at a preset area on the support substrate 11, with its pad side surface directing to a side opposite to the support substrate 11. The semiconductor element 12 is mounted on the support substrate 11 and buried by being covered by the burying insulating layer 13. The pads, not shown, of the semiconductor element 12 are electrically connected to the fan-out interconnections 14 via an unnumbered basis hole 24 bored through the burying insulating layer 13. The semiconductor element 12 may have its thickness adjusted depending on the thickness of the semiconductor device. In Example 1, the semiconductor element 12 has a thickness of 50 μm, with the chip size thereof being 10 mm square. There may be a plurality of the semiconductor elements 12 enclosed in the semiconductor device 1.

The support substrate 11 is a board that supports the semiconductor element 12, and is arranged on a side of the semiconductor element 12 opposite to its pad side surface. The support substrate 11 is wider in area than the semiconductor element 12. The support substrate 11 is formed preferably of metal and most preferably of copper in view of the heat radiation property and productivity, inclusive of the production cost, of the semiconductor device. The support substrate 11, which is 510 mm×610 mm in size and 250 μm in thickness, and which is formed of a copper alloy, was used in Example 1.

The burying insulating layer 13 is an insulating layer used for burying the semiconductor element 12 therein on top of the support substrate 11. The burying insulating layer 13 includes a basis hole 24 (or recess) in register with the pad 12$a$ of the semiconductor element 12. The basis hole 24 serves for electrically connecting the fan-out interconnection 14 to the pad 12$a$ of the semiconductor element 12. The fan-out interconnection 14, electrically connected to the pad 12$a$ of the semiconductor element 12, is formed on the top of the burying insulating layer 13. The burying insulating layer 13 may be formed of, for example, a photosensitive or non-photosensitive organic material. The organic material may, for example, be an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin. The organic material may also be a material obtained on impregnating a woven cloth or a non-woven cloth formed of, for example, araramide fibers, or a glass cloth, with an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin. In Example 1, the burying insulating layer 13 formed of an epoxy resin was used.

The fan-out interconnection 14 is a leader line taken out from the pad of the semiconductor element 12 to an area outside the outer periphery of the semiconductor element 12 on the top of the burying insulating layer 13. The fan-out interconnection 14 is electrically connected to the pad of the semiconductor element 12 via the basis hole 24 bored through the burying insulating layer 13. The fan-out interconnection 14 may be formed of at least one metal, selected from the group consisting of copper, silver, gold, nickel, aluminum, titanium, molybdenum, tungsten and palladium, and an alloy of these metals. In particular, in view of the electrical resistance value and cost, the fan-out interconnection 14 is formed of copper. In Example 1, the fan-out interconnection 14 of copper was used. It is noted that, although the fan-out interconnection 14 is led out from the pad, not shown, of the semiconductor element 12 to an area on top of the burying insulating layer 13, the fan-out interconnection 14 and the pad of the semiconductor element 12 may be interconnected by a conformal via or a filled via. In Example 1, a copper filled via was used.

The interconnection thickness reinforcement portion 15 adds a thickness to the thickness of the fan-out interconnection 14 to augment the mechanical strength of the burying insulating layer 13 and the fan-out interconnection 14. The interconnection thickness reinforcement portion plays the role of preventing the cracking of the portions of the burying insulating layer 13 and the fan-out interconnection 14 overlying the outer periphery of the semiconductor element 12. The interconnection thickness reinforcement portion 15 is provided on the top of the fan-out interconnection 14 at a preset area directly above the outer periphery of the semiconductor element 12. As is the fan-out interconnection 14, the interconnection thickness reinforcement portion 15 is formed of an electrically conductive material that forms the interconnection, specifically, copper, silver, gold, nickel, aluminum, titanium, molybdenum, tungsten or palladium, or an alloy of these metals. In particular, in view of the electrical resistance value and cost, the interconnection thickness reinforcement portion 15 is formed of copper. Should a greater reinforcement portion effect be desired, the interconnection thickness reinforcement portion 15 may be formed of a metal higher in the modulus of elasticity than copper, such as molybdenum. In Example 1, copper was used for the interconnection thickness reinforcement portion 15. Preferably, the film thickness of the interconnection thickness reinforcement portion 15 is smaller than that of the fan-out interconnection 14 from the perspective of reducing the thickness of the overall device.

The operational reliability of the semiconductor device of Example 1 of the present invention will now be considered in comparison with that of the conventional Example(s). FIGS. 9 to 13 depict cross-sectional views for illustrating semiconductor devices of conventional Examples.

Figure 9:
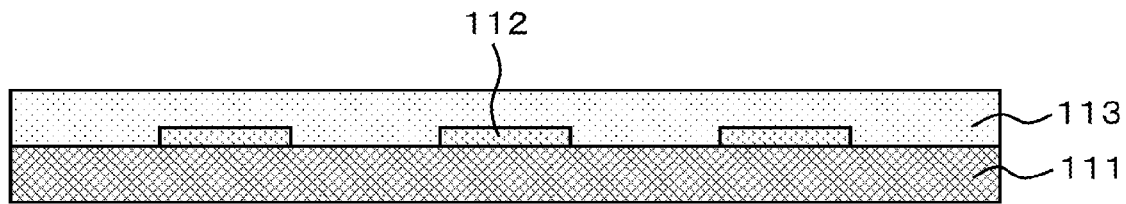
FIG. 9 is a schematic cross-sectional view showing the state of a semiconductor device of a conventional Example at a temperature in the vicinity of the curing temperature of the burying insulating layer.

A silicon semiconductor element 112, reduced in thickness, was mounted face-up on a large sized support substrate 111 of 510 nm×610 mm, and subsequently sealed by a burying insulating layer 113. FIG. 9 depicts a cross-sectional view of the resulting product at a temperature in the vicinity of a curing temperature, close to the maximum temperature, in the curing process of the burying insulating layer 113. At the temperature close to the curing point, the cross-sectional shape is substantially flat. However, when the temperature is lowered to the ambient temperature, the burying insulating layer 113 is contracted in a transverse direction due to the difference in the thermal expansion coefficients of the support substrate 111 and the burying insulating layer 113. Hence, the support substrate 111 in its entirety is flexed so as to be convexed downwards. It is noted that the thermal expansion coefficient of copper, as a material for the support substrate 111, is ca. 17 ppm/K, whereas that of an epoxy resin, as a material for the burying insulating layer 113, is ca. 60 ppm/K. On the other hand, in case the enclosed semiconductor element 112 is formed of Si, its thermal expansion coefficient is ca. 3.5 ppm/K, such that, locally, only the semiconductor element 112 with the lowest value of the thermal expansion coefficient is flexed so as to be concave downwards, that is, convexed upwards, as shown in FIG. 10.

Figure 10:
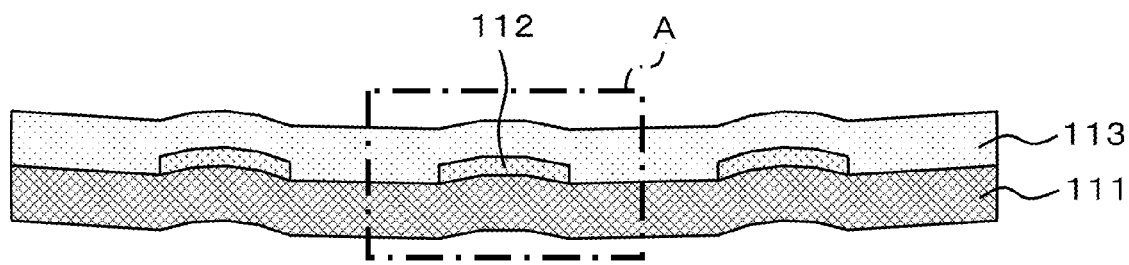
FIG. 10 is a schematic cross-sectional view showing the state of the semiconductor device of a conventional Example at a temperature in the vicinity of the ambient temperature.
Figure 11:
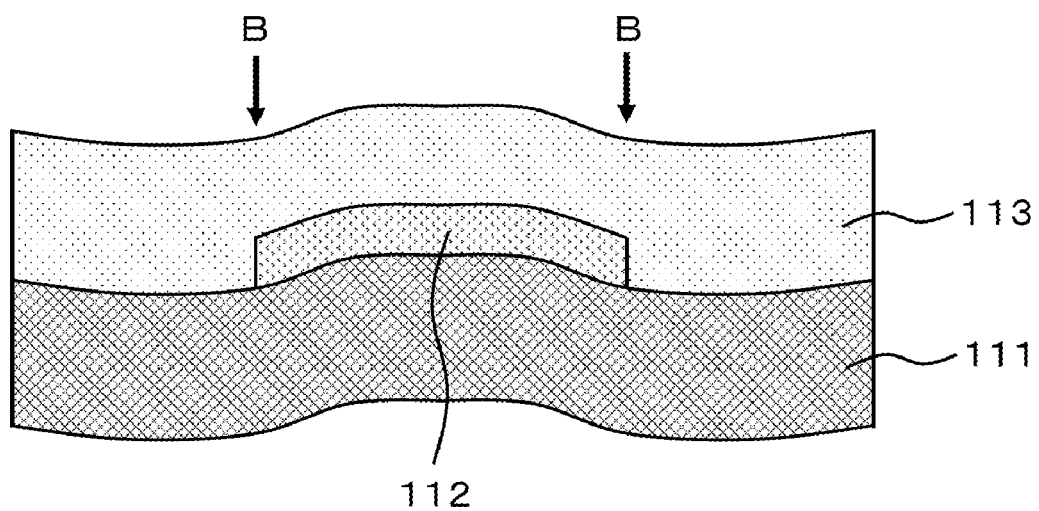
FIG. 11 is an enlarged cross-sectional view showing an area A of FIG. 10 for the semiconductor device of the conventional Example.
Figure 12:
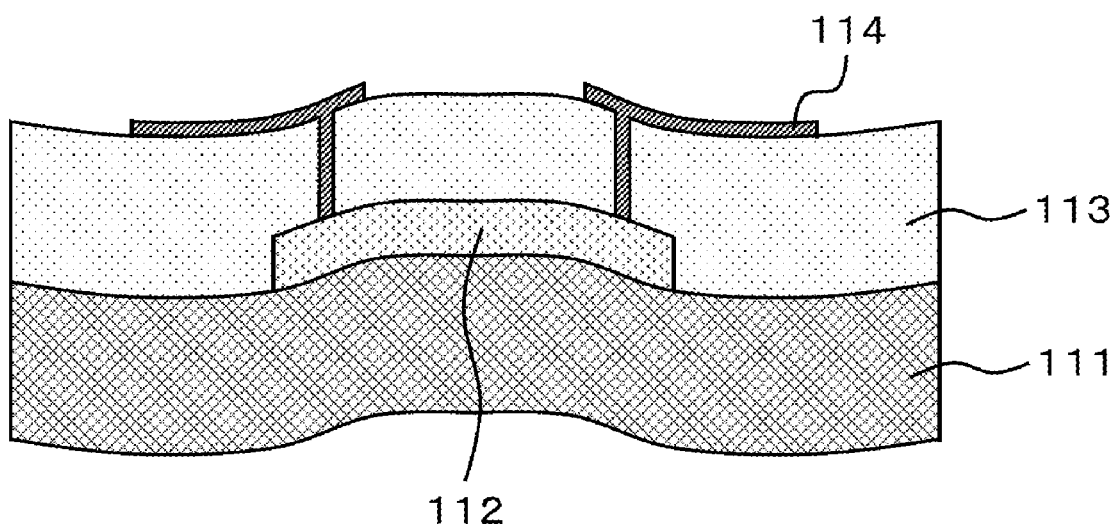
FIG. 12 is a cross-sectional view showing the state of the semiconductor device of a conventional Example provided with a fan-out interconnection.
Figure 13:
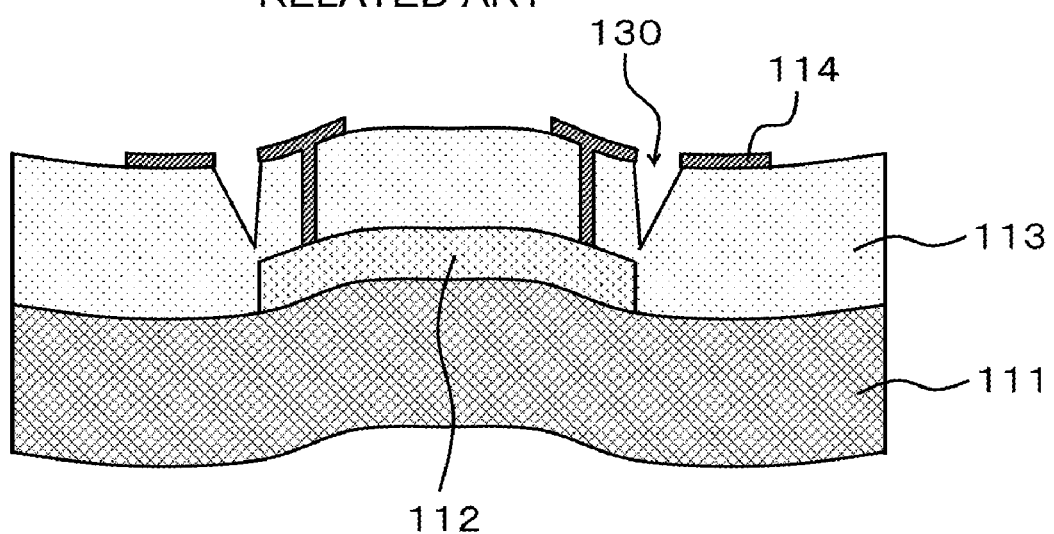
FIG. 13 is a cross-sectional view showing the state of the semiconductor device of a conventional Example where cracking occurred in the burying insulating layer.

FIG. 11 shows the area A of FIG. 10 to an enlarged scale. An area delimited between arrows B is a site directly above and delimited by the outer periphery of the semiconductor element 112. In the vicinity of a location directly above the outer periphery of the semiconductor element 112, there is an inflection point where the flexed shape of the burying insulating layer 113 is changed from upwardly convex to downwardly convex. FIG. 12 depicts a cross-sectional view of the semiconductor device in which there are provided the fan-out interconnections 114. In the conventional Example, there is provided no reinforcement portion such as the interconnection thickness reinforcement portion 15 shown in FIG. 1. The film thickness of the fan-out interconnections 114 on the burying insulating layer 113 is substantially uniform in comparison with Example 1 (see FIG. 1).

The semiconductor device of the conventional Example, shown in FIG. 12, was put to a heat cycle test (for example, −55° C. ten minutes to +125° C. ten minutes). The burying insulating layer 113 was cracked in the vicinity of the area B in FIG. 11, so that, as a semiconductor device, disconnection (open) failure(s) of the fan-out interconnection 114 occurred.

On the other hand, the semiconductor device according to Example 1 was put to a reliability test to conduct comparative evaluation. It was seen that no failure occurred up to a 2000th cycle. The reason is thought that, in an area on the top of the burying insulating layer 13 and directly above the outer rim of the chip (area B), the interconnection is substantially increased in thickness by the interconnection thickness reinforcement portion 15, resulting in an increased mechanical strength.

With Example 1, it is possible to realize a semiconductor device of high operational reliability having buried therein a semiconductor element including a larger number of pads at a narrow pitch. In particular, the semiconductor device may be improved in the cyclic temperature test characteristic. Moreover, since the interconnections are directly led out from the pads of the semiconductor device, it is possible to improve the size and the thickness of the semiconductor device and to improve its electro-migration characteristic. In addition, since the support substrate, carrying the semiconductor element, is of a larger size, the production efficiency may be improved, while the semiconductor device may be lowered in cost.

Example 2

Figure 2:
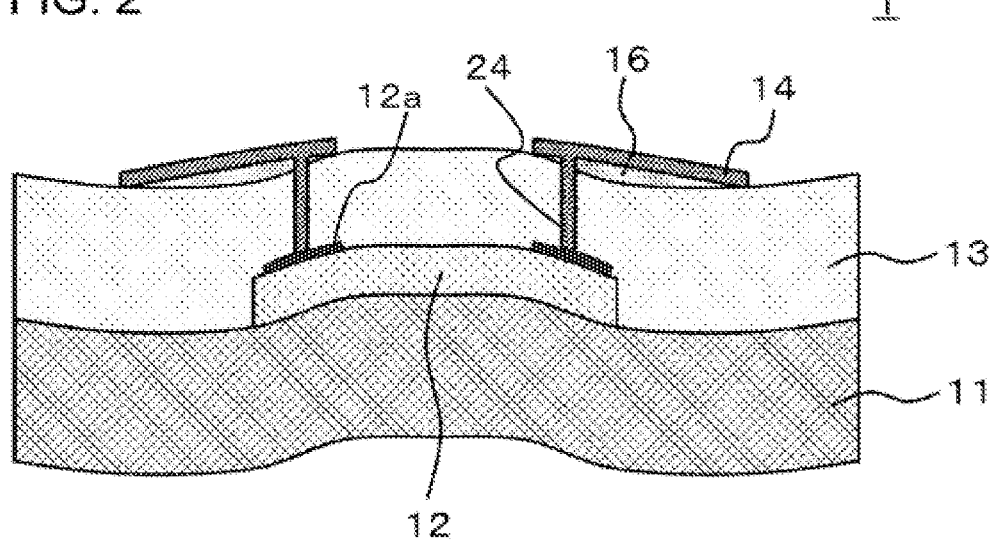
FIG. 2 is a schematic cross-sectional view showing the configuration of a semiconductor device according to Example 2 of the present invention.

The semiconductor device of Example 2 of the present invention will now be described. FIG. 2 depicts a schematic cross-sectional view showing the configuration of a semiconductor device according to Example 2 of the present invention.

In the semiconductor device of Example 2, the interconnection thickness reinforcement portion (15 of FIG. 1) of Example 1 is not provided. Instead, an insulating layer thickness reinforcement portion 16 is provided in a preset area above the outer periphery of the semiconductor element 12. The insulating layer thickness reinforcement portion 16 serves for preventing cracking of the portion of the burying insulating layer 13 overlying the outer periphery of the semiconductor device 12. The insulating layer thickness reinforcement portion 16 is arranged between the burying insulating layer 13 and the fan-out interconnection 14. Otherwise, the configuration of the present Example 2 is similar to that of Example 1.

The insulating layer thickness reinforcement portion 16 is arranged directly above the outer periphery of the semiconductor device 12. In Example 2, the insulating layer thickness reinforcement portion 16 is formed of an insulation material that, in conjunction with the insulating layer 13, forms an insulation layer. The insulating layer thickness reinforcement portion 16 includes a basis hole 24 (or recess) in register with the pad 12a of the semiconductor device 12. The basis hole 24 serves for electrically connecting the fan-out interconnection 14 to the pad 12a of the semiconductor device 12. The insulating layer thickness reinforcement portion 16 may be formed of, for example, a photosensitive or non-photosensitive organic material. As the organic material, an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin, may be used. A woven cloth or a non-woven cloth formed of, for example, araramide fibers, or a glass cloth, impregnated with an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin, may also be used. In view of cost, in particular, the insulating layer thickness reinforcement portion 16 may be formed of the same material as that of the burying insulating layer 13. For further enhancing the reinforcement portion effect, the insulating layer thickness reinforcement portion 16 may be formed of a material higher in the modulus of elasticity than the burying insulating layer 13, for example, a reinforced resin, such as an epoxy resin reinforced by a glass cloth. In Example 2, an epoxy resin was used. From the perspective of reducing the thickness of the device, the film thickness of the insulating layer thickness reinforcement portion 16 is preferably smaller than that of the fan-out interconnection 14.

The operational reliability of the semiconductor device according to Example 2 of the present invention will now be considered. As in Example 1, the semiconductor device according to Example 2 was put to a reliability test to conduct comparative evaluation with respect to the conventional technique. It was seen that no failure occurred up to a 2000th cycle, thus testifying to high operational reliability. The reason is thought that the thickness of the burying insulating layer 13 was substantially increased by the insulating layer thickness reinforcement portion 16, resulting in an increased mechanical strength.

The meritorious effects similar to those of Example 1 may be obtained with the present Example 2.

Example 3

A semiconductor device according to Example 3 of the present invention will now be described with reference to the drawings. FIG. 3 is a schematic plan view showing the configuration of a semiconductor device according to Example 3 of the present invention.

A semiconductor device of Example 3 is a package in which a semiconductor element 12 is buried (enclosed) in the bulk of a wiring board comprised of a support substrate 11, a burying insulating layer 13 and a plurality of fan-out interconnections (wiring traces) 14. To prevent cracking of the portion of the burying insulating layer 13 overlying the outer periphery of the semiconductor element 12, the semiconductor device 1 includes a reinforcement portion via interconnection 17. The reinforcement portion via interconnection is connected to at least one end part (corner) of the semiconductor element 12, while not being connected to the fan-out interconnections 14. The reinforcement portion via interconnection performs the role of preventing cracking of the burying insulating layer 13 overlying the outer periphery of the semiconductor element 12.

The semiconductor element 12 is a semiconductor chip, such as, for example, a silicon semiconductor element, and includes a plurality of pads, not shown, on its one side surface. The semiconductor element 12 is mounted on the support substrate 11 at a preset area thereof so that its pad side surface will be directed to a side opposite to the support substrate side. The semiconductor element 12 is mounted on the support substrate 11 and buried by being covered by the burying insulating layer 13. The pads 12a of the semiconductor element 12 are electrically connected to the fan-out interconnections 14 via unnumbered basis holes bored through the burying insulating layer 13. The semiconductor element 12 may have its thickness adjusted depending on the thickness of the semiconductor device. In Example 3, the semiconductor element 12 has a thickness of 50 μm, with a chip size being 10 mm square. There may be a plurality of the semiconductor elements 12 buried (enclosed) in the semiconductor device 1.

The support substrate 11 plays the role of supporting the semiconductor element 12, and is arranged on a side of the semiconductor element 12 opposite to its pad side surface. The support substrate 11 is wider in area than the semiconductor element 12. The support substrate 11 is formed preferably of metal and most preferably of copper in view of the heat radiation property and productivity, inclusive of production cost, of the semiconductor device. The support substrate 11, which is 510 mm×610 mm in size and 250 μm in thickness, and which is formed of a copper alloy, was used in Example 3.

The burying insulating layer 13 is an insulating layer that is provided on top of the support substrate 11, and that is used for burying the semiconductor element 12 therein. The burying insulating layer 13 includes a basis hole (or recess) in register with a pad, not shown, of the semiconductor element 12. The basis hole serves for electrically connecting the fan-out interconnection 14 to the pad 12a of the semiconductor element 12. On the burying insulating layer 13 is formed the fan-out interconnection 14 electrically connected to a pad, not shown, of the semiconductor element 12. The burying insulating layer 13 may be formed of, for example, a photosensitive or non-photosensitive organic material. As the organic material, an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin may be used. Or, a woven cloth or a non-woven cloth formed of, for example, araramide fibers, or a glass cloth, impregnated with an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin, may also be used. In Example 3, the burying insulating layer 13 formed of an epoxy resin was used.

The fan-out interconnection 14 is a leader line (wiring trace) taken out from the pad of the semiconductor element 12 to an area of the surface of the burying insulating layer 13 outside the area of the semiconductor element 12. The fan-out interconnection 14 is electrically connected to the pad 12a of the semiconductor element 12 via the basis hole bored through the burying insulating layer 13. The fan-out interconnection 14 is formed of at least one metal, selected from the group consisting of copper, silver, gold, nickel, aluminum, titanium, molybdenum, tungsten and palladium, and an alloy of these metals. In particular, in view of the electrical resistance value and cost, the fan-out interconnection 14 is desirably formed of copper. In Example 3, the fan-out interconnection 14 of copper was used. It is noted that, although the fan-out interconnection 14 is led out from the pad 12a of the semiconductor element 12 to an area of the surface of the burying insulating layer 13, the fan-out interconnection 14 and the semiconductor element 12 may be interconnected by a conformal via or a filled via. In Example 3, a copper filled via was used.

The reinforcement portion via interconnection 17 is a via interconnection that is connected to at least one end part (corner) of the semiconductor element 12, while not being connected to the fan-out interconnections 14. The reinforcement portion via interconnection 17 is buried in a basis hole bored through the burying insulating layer 13 and is connected to the corner (end) of the semiconductor element 12. The reinforcement portion via interconnection 17 is formed of at least one metal selected from the group consisting of copper, silver, gold, nickel, aluminum, titanium, molybdenum, tungsten and palladium, and an alloy of these metals. In particular, in view of the electrical resistance value and cost, the reinforcement portion via interconnection 17 is desirably formed of copper. In Example 3, the reinforcement portion via interconnection 17 of copper was used. It is unnecessary to provide the reinforcement portion via interconnection 17 at each of the four ends (corners) of the semiconductor element 12, such that three or a smaller number of reinforcement portion via interconnections 17 are sufficient.

The operational reliability of the semiconductor device according to Example 3 of the present invention will now be considered. As in Example 1, the semiconductor device according to Example 3 was put to a reliability test to conduct comparative evaluation with respect to the conventional technique. It was seen that no failure occurred up to a 2000th cycle, thus testifying to high operational reliability. The reason is thought that, by the reinforcement portion via interconnections 17, the stress produced at the time of the cyclic temperature test was moderated and, in particular, the cracking of the insulating layer, initiated at the end part of the semiconductor element 12, was suppressed.

With Example 3, the meritorious effects similar to those of Example 1 may be obtained.

Example 4

Figure 4A:
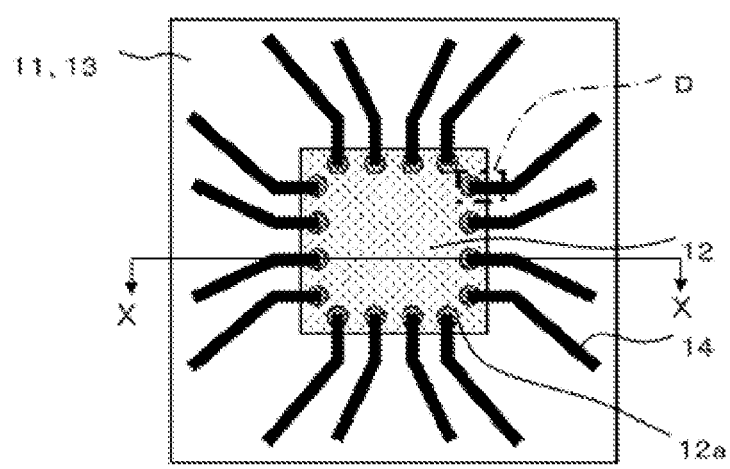
FIG. 4A is a schematic plan view showing the configuration of a semiconductor device according to Example 4 of the present invention.
Figure 4B:
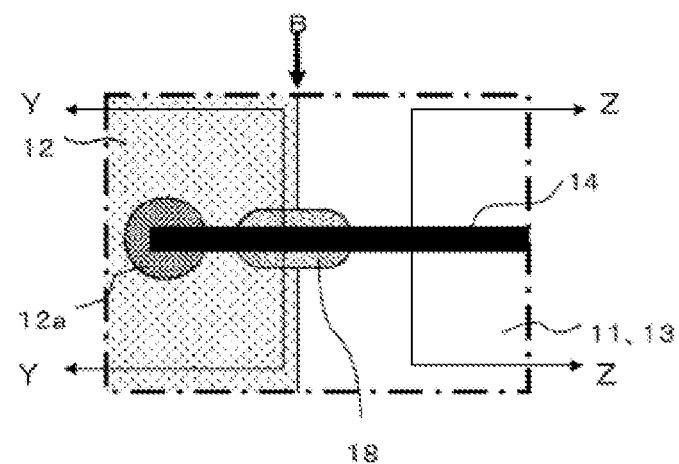
FIG. 4B is an enlarged plan view showing an area D of FIG. 4A.
Figure 4C:
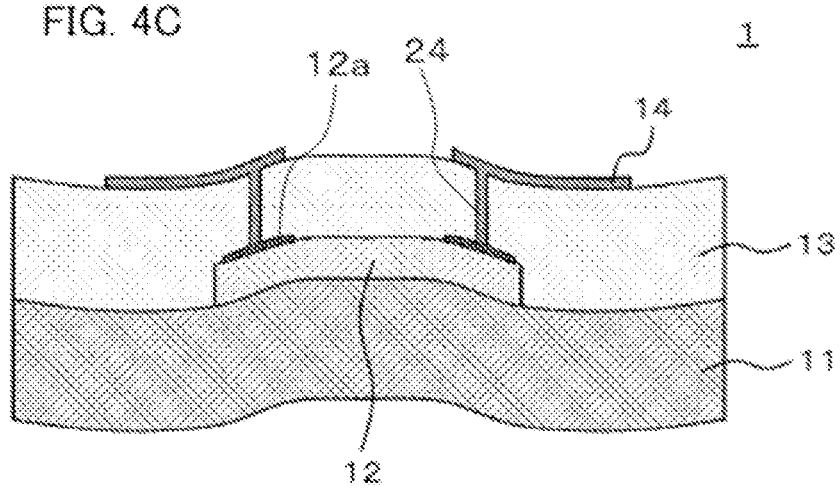
FIG. 4C is a schematic cross-sectional view along an X-X line of FIG. 4A.
Figure 4D:
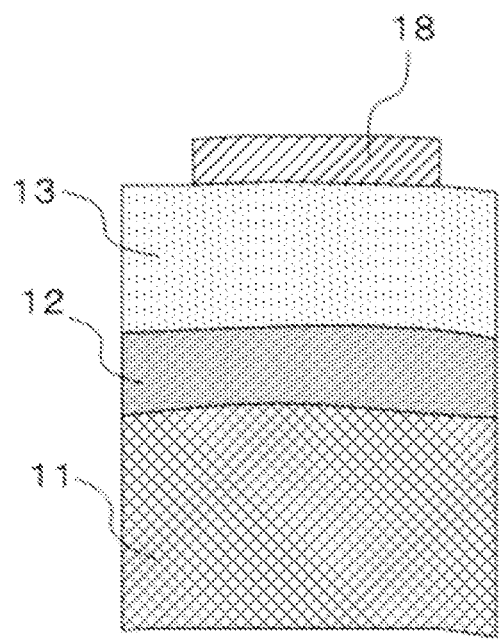
FIG. 4D is a schematic cross-sectional view along a Y-Y line of FIG. 4B
Figure 4E:
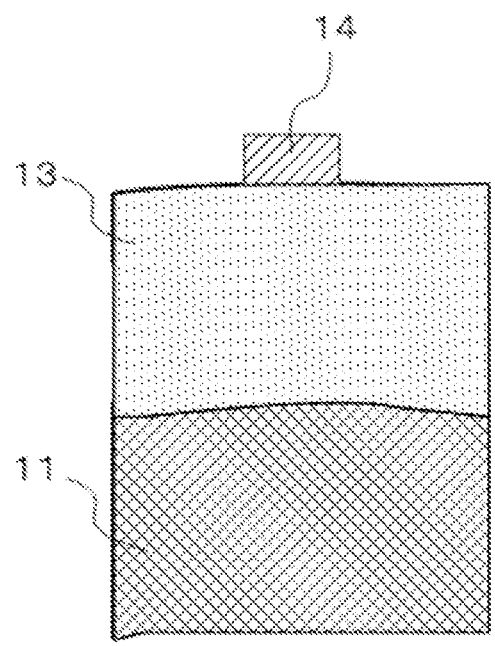
FIG. 4E is a schematic cross-sectional view along a Z-Z line of FIG. 4B.

A semiconductor device according to Example 4 of the present invention will now be described with reference to the drawings. FIG. 4A depicts a schematic top plan view showing the configuration of a semiconductor device according to Example 4 of the present invention, and FIG. 4B depicts an enlarged plan view showing an area D of FIG. 4A. FIG. 4C depicts a schematic cross-sectional view along an X-X line of FIG. 4A. FIG. 4D and FIG. 4E are schematic cross-sectional views along a Y-Y line and a Z-Z line of FIG. 4B, respectively.

In the semiconductor device according to Example 4 of the present invention, the interconnection thickness reinforcement portion (15 of FIG. 1) of Example 1 is not provided. Instead, an interconnection width reinforcement portion 18 is provided in a preset area on the top of the outer periphery of the semiconductor element 12. The role of the interconnection width reinforcement portion 18 is to prevent cracking of the burying insulating layer 13 that may otherwise occur in the area on the top of the outer periphery of the semiconductor element 12. In other respects, the configuration of the present Example is similar to that of Example 1.

The interconnection width reinforcement portion 18 augments the width of the fan-out interconnection 14, and becomes wider in width in an area traversing the area B. The interconnection width reinforcement portion 18 is formed of copper, silver, gold, nickel, aluminum, titanium, molybdenum, tungsten or palladium, or an alloy of these metals. In particular, in view of cost, the interconnection width reinforcement portion 18 is formed of copper. Should a greater reinforcement portion effect be desired, the interconnection thickness reinforcement portion may be formed of a metal higher in the modulus of elasticity than copper, such as molybdenum. In Example 4, copper was used.

The operational reliability of the semiconductor device according to Example 4 of the present invention will now be considered. As in Example 1, the semiconductor device according to Example 4 was put to a reliability test to conduct comparative evaluation with respect to the conventional technique. It was seen that no failure occurred up to a 2000th cycle, thus testifying to high operational reliability. This may possibly arise from the fact that, by the interconnection width reinforcement portion 18, the stress produced in the cyclic temperature test was moderated and, in particular, the cracking of the insulating layer, which would be otherwise initiated at the periphery of the semiconductor element 12, was suppressed.

Example 5

Figure 5:
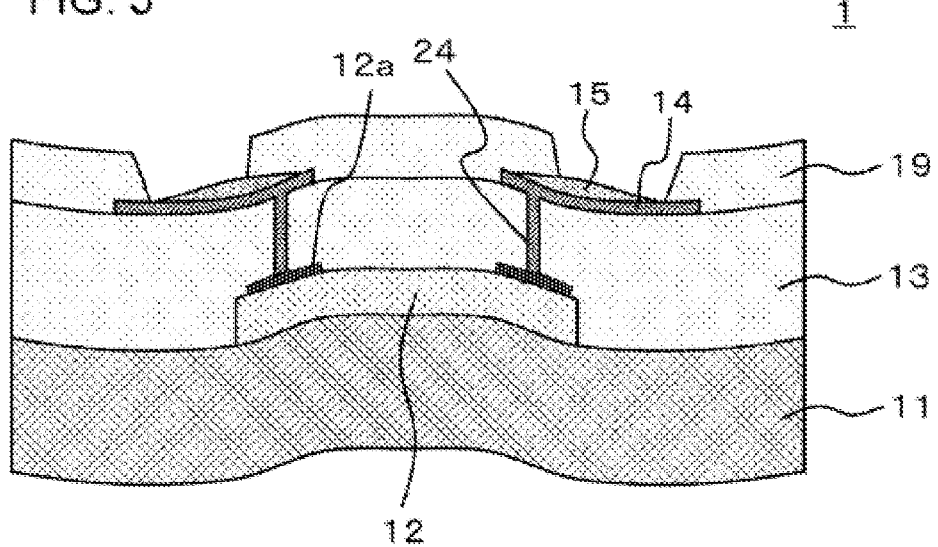
FIG. 5 is a schematic cross-sectional view showing the configuration of a semiconductor device according to Example 5 of the present invention.
Figure 6:
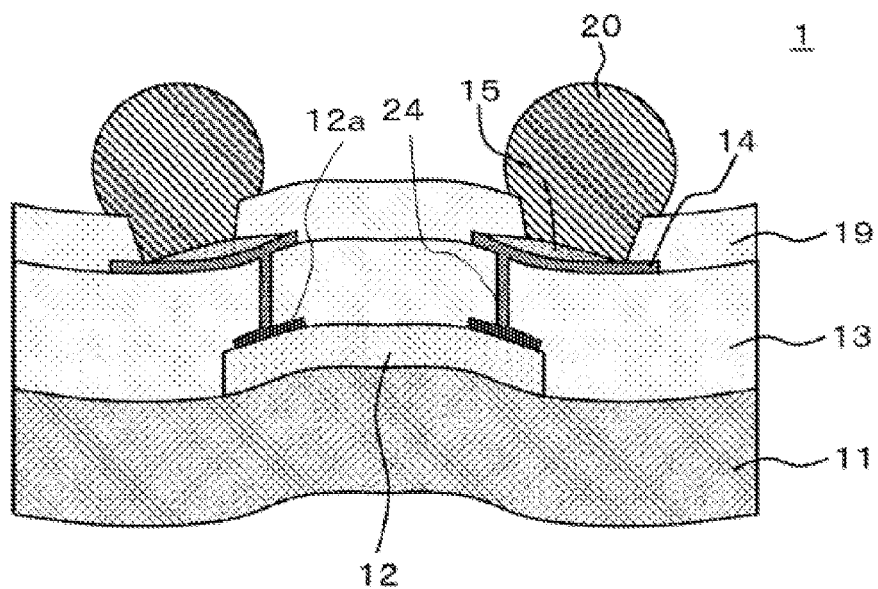
FIG. 6 is a schematic cross-sectional view showing the configuration of an example application of the semiconductor device according to Example 5 of the present invention.

A semiconductor device according to Example 5 of the present invention will now be described with reference to the drawings. FIG. 5 depicts a schematic cross-sectional view showing the configuration of the semiconductor device according to Example 5 of the present invention. FIG. 6 depicts a schematic cross-sectional view showing the configuration of an example application of the semiconductor device according to Example 5 of the present invention.

In the semiconductor device 1 of Example 5 of the present invention, a cover film 19 (see FIG. 5) is formed on the surface of the burying insulating layer 13 of the semiconductor device according to Example 1 (see FIG. 1). The cover film 19 is an insulating layer, and includes an opening at a preset portion of the fan-out interconnection 14 or the interconnection thickness reinforcement portion 15. A ball-shaped external terminal 20 may be provided in the opening of the cover film 19 (see FIG. 6).

For the cover film 19, an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin, may be used. A woven cloth or a non-woven cloth formed of, for example, araramide fiber, or a glass cloth, impregnated with an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin, may also be used. A photosensitive resist ink may also be used. In Example 1, a photosensitive resist ink was used as the cover film 19.

For the external terminal 20, at least one metal selected from the group consisting of gold, silver, copper, tin and a solder material, or an alloy thereof, may be used. In Example 5, nickel and gold were laminated in this order to 3 µm and to 0.5 µm, respectively.

In Example 5, the meritorious effects similar to those obtained in Example 1 may be displayed. In addition, the major portions of the fan-out interconnection 14 may be covered with the cover film 19 to prevent scars in the interconnections or in the insulating layers due to mechanical contact or to minimize the adverse corrosive effect of the moisture. A semiconductor device may thus be packaged directly on a motherboard.

In Example 5, the mode of using the interconnection thickness reinforcement portion 15 for reinforcement portion has been taken up for explanation. The present invention is not limited to this configuration. That is, similar covering structures may also be provided to the insulating layer thickness reinforcement portion (16 of FIG. 2), reinforcement portion via interconnection (17 of FIG. 3) or to the interconnection width reinforcement portion (18 of FIG. 4B) to yield comparable meritorious effects.

Example 6

Figure 7:
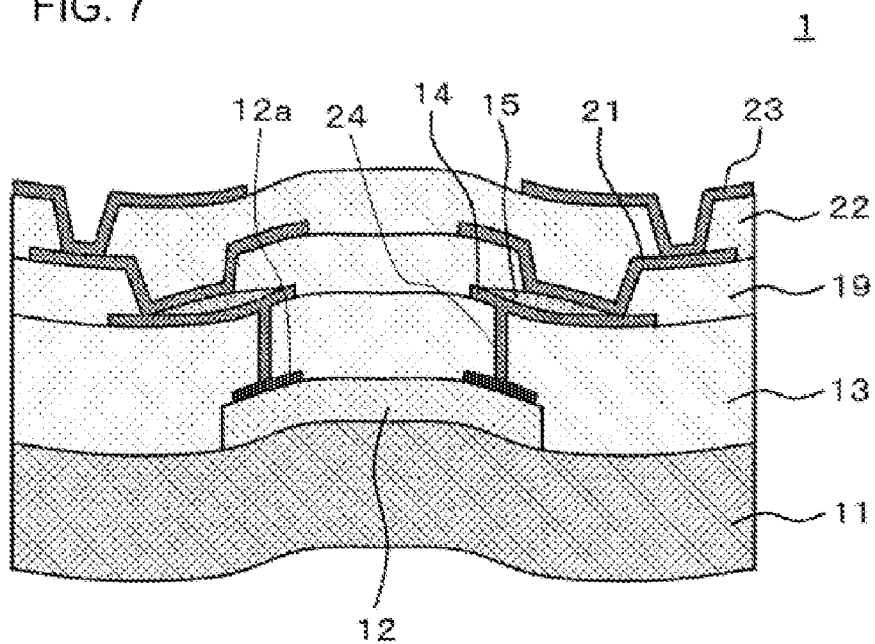
FIG. 7 is a schematic cross-sectional view showing the configuration of a semiconductor device according to Example 6 of the present invention.
Figure 8:
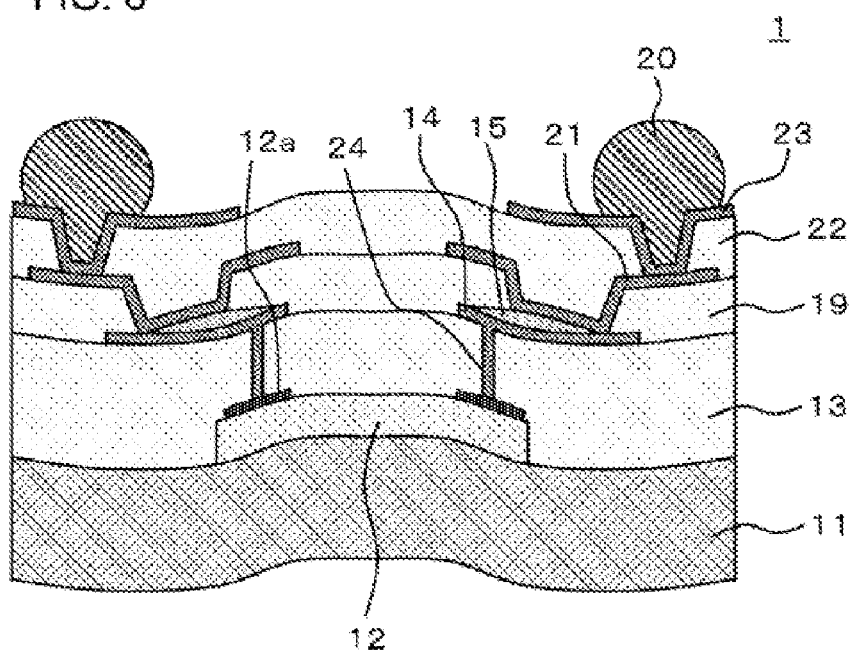
FIG. 8 is a schematic cross-sectional view showing the configuration of an example application of the semiconductor device according to Example 6 of the present invention.

A semiconductor device according to Example 6 of the present invention will now be described with reference to the drawings. FIG. 7 depicts a schematic cross-sectional view showing the configuration of the semiconductor device according to Example 6 of the present invention. FIG. 8 depicts a schematic cross-sectional view showing the configuration of an application of the semiconductor device according to Example 6 of the present invention.

In the semiconductor device 1 of Example 6, a second interconnection layer 21, a second insulating layer 22 and a third interconnection layer 23 are laminated in this order on the cover film 19 of the semiconductor device of Example 5 (see FIG. 5) to form a multi-layered interconnection structure (see FIG. 7). The second interconnection layer 21 is electrically connected to the fan-out interconnection 14 or to the interconnection thickness reinforcement portion 15 via an opening formed through the cover film 19. The third interconnection layer 23 is electrically connected to the second interconnection layer 21 via an opening formed through the second interconnection layer 22. A ball-shaped external terminal 20 may be provided at a preset portion of the third interconnection layer 23 (see FIG. 8).

For the second interconnection layer 22, an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin may be used. A woven cloth or a non-woven cloth formed of, for example, araramide fibers, or a glass cloth, impregnated with an epoxy resin, an epoxy acrylate resin, a urethane acrylate resin, a polyester resin, a phenolic resin, a polyimide resin, BCB (benzocyclobutene), PBO (polybenzoxazole) or a polynorbornene resin may also be used.

For the second interconnection layer 21 and the third interconnection layer 23, the materials similar to those used for the fan-out interconnection 14 may be used.

In Example 6, meritorious effects similar to those of Example 1 may be displayed, while long-term reliability may also be secured. In addition, the power supply and the ground may be strengthened by the multi-layer interconnection, while it becomes possible to take out a multi-pin signal.

In Example 6, the number of the interconnection layers is three, while that of the insulating layers, inclusive of the cover film 19, is two. However, there is no limitation to the number of the layers, such that any suitable number of the interconnection layers may be used as necessary.

In Example 6, only the mode of reinforcement portion by the interconnection thickness reinforcement portion 15 is taken up for explanation. However, the present invention is not limited to this configuration. Viz., a similar multi-layered interconnection structure may also be provided to the insulating layer thickness reinforcement portion (16 of FIG. 2), reinforcement portion via interconnection (17 of FIG. 3) or to the interconnection width reinforcement portion (18 of FIG. 4B) to yield similar meritorious effects.

In the semiconductor device of the present invention, an LCR element, performing the role of a circuit noise filter, may be provided on a desired site of the multi-layered interconnection structure. In particular, a dielectric material, forming a capacitor, may preferably be metal oxides, such as titanium oxide, tantalum oxide, $Al_2O_3$, $SiO_2$, $ZrO_2$, $HfO_2$ or $Nb_2O_3$, perovskite materials, such as BST ($Ba_xSr_{1-x}TiO_3$), PZT ($PbZr_xTi_{1-x}O_3$) or PLZT ($Pb_{1-y}La_yZr_xTi_{1-x}O_3$), or Bi-based laminar compounds, such as $SrBi_2Ta_2O_9$, where $0 \leq x \leq 1$ and $0 < y < 1$. As a dielectric material that composes a capacitor, an organic material, mixed with an inorganic material or a magnetic material, may be used, too.

In the semiconductor device of the present invention, there may be two or more semiconductor elements buried (enclosed). Passive components, such as LCR components, MEMS components or sensors may also be enclosed in addition to the semiconductor elements.

The reinforcement portions in the semiconductor device of the present invention, that is, the interconnection thickness reinforcement portion or the insulating layer thickness reinforcement portion, are provided in preset areas on top of the outer periphery of the semiconductor element, specifically, in an area directly above the semiconductor element and a transversely near-by area. The reinforcement portions are preferably arranged at least in an area outside of the area directly above the outer periphery of the semiconductor element. It is because the area of the fan-out interconnection lying outside of the area directly above the outer periphery of the semiconductor element, where the mechanical strength of the fan-out interconnection becomes lowest, may thereby be effectively reinforced. In particular, the mechanical strength is lowered in an area of a length not more than twice the thickness of the semiconductor element from a location directly above the outer periphery of the semiconductor element. It is therefore most preferred to reinforce this area.

With the semiconductor device of the present invention, described above, stress concentration during the manufacture process may be suppressed to a minimum. As a result, a semiconductor device with only little flexure or undulation may be provided to improve reliability.

It is noted that the particular exemplary embodiments or examples may be modified or adjusted within the gamut of the entire disclosure of the present invention, inclusive of claims, based on the fundamental technical concept of the invention. Further, variegated combinations or selection of elements disclosed herein may be made within the scope of the claims. That is, the present invention may encompass various modifications or corrections that may occur to those skilled in the art in accordance within the gamut of the entire disclosure of the present invention, inclusive of claims and the technical concept of the present invention.

What is claimed is:

1. A semiconductor device comprising: a semiconductor element; a support substrate arranged on a surface of said semiconductor element opposite to a surface thereof provided with a pad, said support substrate being bigger in area than said semiconductor element; a burying insulating layer on said support substrate for burying said semiconductor element therein; a fan-out interconnection led out from said pad via a basis hole bored through said burying insulating layer to an area on said burying insulating layer lying more peripherally outwardly than said semiconductor element; and a reinforcement portion arranged in a preset area on top of outer periphery of said semiconductor element for augmenting the mechanical strength of said burying insulating layer and said fan-out interconnection, wherein said reinforcement portion is an interconnection width reinforcement portion that augments width of said fan-out interconnection and the interconnection width of said interconnection width reinforcement portion is wider than that of said fan-out interconnection.

2. The semiconductor device according to claim 1, wherein said interconnection width reinforcement portion is formed of the same material as that of said fan-out interconnection.

3. A semiconductor device comprising: a semiconductor element; a support substrate arranged on a surface of said semiconductor element opposite to a surface thereof provided with a pad, said support substrate being bigger in area than said semiconductor element; a burying insulating layer on said support substrate for burying said semiconductor element therein; a fan-out interconnection led out from said pad via a basis hole bored through said burying insulating layer to an area on said burying insulating layer lying more peripherally outwardly than said semiconductor element; and a reinforcement portion arranged in a preset area on top of outer periphery of said semiconductor element for augmenting the mechanical strength of said burying insulating layer and said fan-out interconnection, wherein said reinforcement portion is an interconnection width reinforcement portion that augments width of said fan-out interconnection and said interconnection width reinforcement portion has a modulus of elasticity higher than that of said fan-out interconnection.

* * * * *